(12) United States Patent
Ogiwara

(10) Patent No.: US 7,169,330 B2
(45) Date of Patent: Jan. 30, 2007

(54) COMPOSITION OF CONDUCTIVE PASTE

(75) Inventor: Toshiaki Ogiwara, Tochigi-Ken (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 514 days.

(21) Appl. No.: 10/786,489

(22) Filed: Feb. 25, 2004

(65) Prior Publication Data

US 2005/0187329 A1   Aug. 25, 2005

(51) Int. Cl.
*H01B 1/22* (2006.01)
(52) U.S. Cl. ...................... 252/512; 252/514
(58) Field of Classification Search ............. 252/511, 252/512, 513, 514; 525/929; 528/312
See application file for complete search history.

(56) References Cited

U.S. PATENT DOCUMENTS

| 5,667,899 A | * | 9/1997 | Yusa et al. ............... 428/473.5 |
| 2005/0154181 A1 | * | 7/2005 | Dueber et al. ............. 528/310 |
| 2006/0159898 A1 | * | 7/2006 | Uchiyama et al. .......... 428/209 |

FOREIGN PATENT DOCUMENTS

| JP | 1993 217420 A | 8/1993 |
| JP | 1994 096685 A | 4/1994 |
| JP | 1995 304868 A | 11/1995 |
| JP | 1997 045132 A | 2/1997 |
| JP | 1997 095533 A | 4/1997 |
| JP | 1998 134636 A | 5/1998 |
| JP | 1998 152630 A | 6/1998 |
| JP | 2000 322933 A | 11/2000 |
| JP | 2001 213962 A | 8/2001 |
| JP | 2002 245852 A | 8/2002 |
| JP | 2002 260443 A | 9/2002 |
| JP | 2002 270034 A | 9/2002 |

* cited by examiner

*Primary Examiner*—Mark Kopec

(57) ABSTRACT

A conductor composition comprising an electrically conductive powder, an organic solvent soluble, polyimide resin and solvent wherein the ratio of conductive powder to organic resin is from 80:20 to 99:1 and wherein polyimide resin comprises chemical units selected from Unit (1)

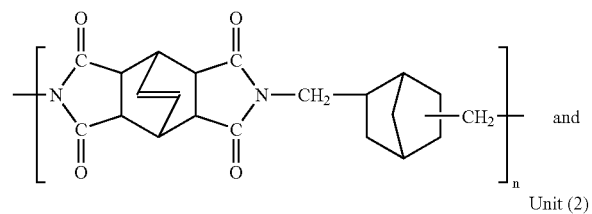

Unit (2)

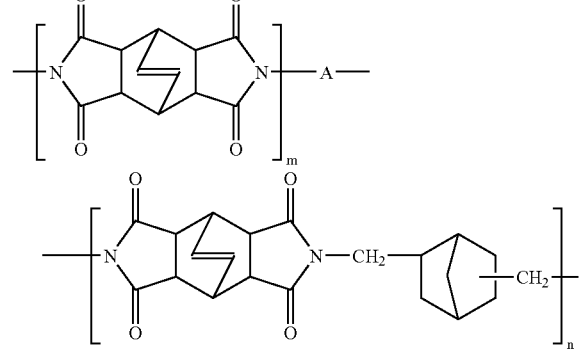

and mixtures of these units and wherein in unit (2) the range of the mole ratio m to n is from 90:10 to 10:90 and A represents diamine compounds which bond the structures of unit (2) into units of the resin.

2 Claims, No Drawings

COMPOSITION OF CONDUCTIVE PASTE

BACKGROUND OF THE INVENTION

The present invention relates to a conductor composition used for low temperature cure/dry but required high thermal resistance, such as circuit lines on the plastic board, termination of resistor/capacitor/inductor, or tantalum capacitor conductive coating material.

The so-called "fired type" conductive paste formulations have been applied to ceramic substrates by printing method to make circuit components including external electrodes for the chip resistor, the chip capacitor or the chip inductor. For flexible substrates, polymer type conductive paste based on organic resin have been instead of the fired type. These pastes, too, are typically applied to the substrate using printing techniques. Since proper viscosity of the conductive paste or composition is essential for application by a printing technique, polymer based pastes are either made using thermosetting or thermoplastic resins. Thermosetting resins are applied as monomers or oligomers having suitable viscosity for paste application. Then on heating the polymer will crosslink or polymerize to deliver the desired properties for the cured paste. On the other hand thermoplastic resins may be used which soften in a solvent for application and dry to a hard film after printing.

In case of using the organic resin, thermoset plastic resin such as epoxy resins or phenolic resins are used for high heat resistant application. The heat applied in to cure thermoset resin based conductive paste, is usually that required to fully polymerized paste. Low cure temperature thermoset resins based conductive pasts usually require that the paste itself should store in refrigerator or freezer so that curing will not begin until before the desired time. Pastes that can be safely stored at room temperature require higher curing temperatures. Problems arise in application of the uncured pastes and in the quality and use properties of the cured pastes if the storage temperature, the cure start temperature and the temperatures tolerance of the substrate are not properly selected.

A second option for polymer based conductive paste formulations is the use of thermoplastic resin such as acrylic resin or polyester resin. Thermoplastic resin based conductive pastes use is almost independent of drying temperature. The reason is the thermoplastic resin do not crosslink or polymerize in the paste system because these resins are already long chain polymer, and the chemical polymerization. Heating of the printed paste is not necessarily required unless to accelerate the evaporation of the solvent. Because the selection of drying conditions includes low temperature and the selection of resin for the paste and the substrate composition includes more possibilities, thermoplastic resins are widely used for preparing the polymer or resin based conductive paste compositions.

Additionally, the shelf-life of the thermoplastic resin based conductive polymer is longer than thermoset plastic resin based paste. However, the thermoplastic resin based paste, generally have poorer thermal resistance compared to the thermal resistance of thermoset resin based paste.

SUMMARY OF THE INVENTION

The present invention are conductive compositions comprising an electrically conductive powder, an organic solvent soluble, polyimide resin and solvent wherein the ratio of conductive powder to organic resin is from 80:20 to 99:1 and wherein polyimide resin comprises chemical units selected from:

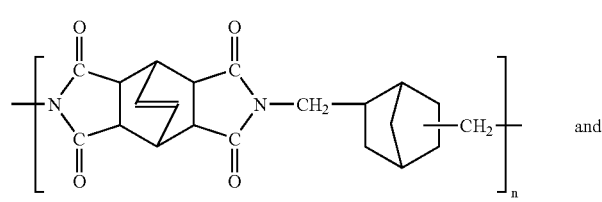

Unit (1)

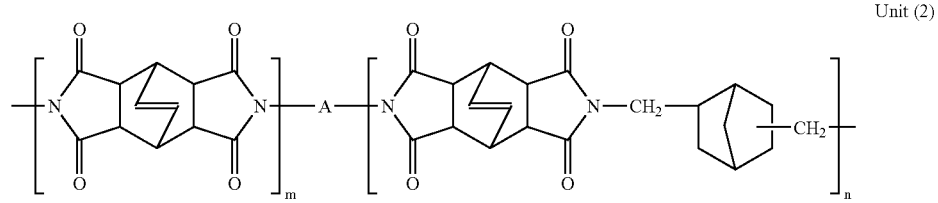

Unit (2)

and mixtures of these units and wherein in unit (2) the range of the mole ratio m to n is from 90:10 to 10:90 and "A" represents diamine compounds which bond the structures of unit (2) into units of the resin. In one embodiment of the invention "A" in unit (2) is selected from 2,2-bis[4-(amino phenoxy)phenyl] propane, diamino siloxane compounds and mixtures of these diamines.

DETAILED DESCRIPTION OF THE INVENTION

It is then desirable to have resin based conductive pastes that in which the resistively is almost independent of the drying temperature and long shelf-life of the thermoplastic resins combined with the temperature resistance of the thermoplastic conductive paste compositions. The inventor in the present invention has achieved this goal by formulating the paste to contain selected, the organic solvent soluble polyimide resins. The organic solvent soluble polyimide resins are known in the art as a class of thermoplastics that are characterized by excellent properties such as solubility in commonly used organic solvents and heat-resistance. In general, these resins are prepared by polymerizing octane tetracarboxylic anhydride and diamine in the proper ratio and under the appropriate conditions. The preparation and description of the polyimide prepared using a stereoisomer of bicyclo [2.2.2. ] octane tetracarboxylic an hydride are described in Japanese Laid Open (Kokai) Patent 07-304868.

The polyimide resins used in the composition of the present invention can be prepared by for example, synthesizing the polyamic acid first at relative low temperature, followed by polyimidization at elevated temperature by placing bicyclo[2.2.2. ]oct-7-en-2,3,5,6tetracarboxylic anhydride and appropriate organic solvent such as DMF or toluene in a reactor, and heating this mixture to 60–120° C. Then adding alone or mixed together 2,5-bis(aminomethyl) bicyclo[2.2.1]heptane alone or 2,6-bis(aminomethyl)bicyclo [2.2.1]heptane drop wise into the reactor, and reacting at 120–160° C. for 10 to 120 minutes. To produce the polyimide the mixture is reacted at 160–200° C. for 1 to 10 hours. After the reaction, the reactant is cool in air, and the reaction mixture is moved to a vessel filled with acetone. The solids in acetone solution may be separated and

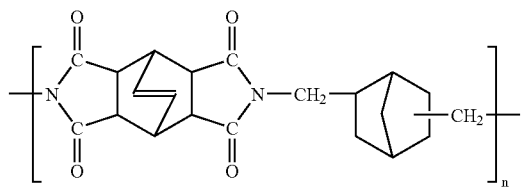

dried. This solid is the polyimide.

The polyimide resins that may be used in this invention are, in general, prepared by the above preparation and have the following general repeated structure units of the formula: wherein n is n=10–300, preferable n=10–150 repeating, but not limited for this range.

A second particularly useful polyimide resins can be prepared from bicyclo[2.2.2]oct-7-en-2.3.6-tetracarboxlic acid dianhydride, 2,2-bis[4-(aminophenoxy)-phenyl]propane, 2,5(2.6)-bis(aminomethyl)-bicyclo[2.2.1]-heptane and/or bis (3-aminopropyl)poly(dimethlsiloxane):

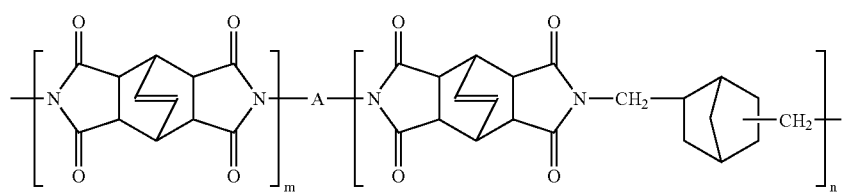

wherein the molecular ratio of m to n from 90to 10 to 10 to 90, A is diamine compounds chemically bonding the two structures to form a polyimide unit, and the sum m+n is from 10 to 300, preferable 10–150.

The conductive powder used for this conductive paste are the powders of precious metal such as silver, gold, platinum, powders of base metal such as copper, nickel, tin, powders of alloy-like solder, graphite, and precious metal plated and alloyed powders.

The conductive powder can be used as one metal based powder or mixtures of several of these types of conductive powders. The ratio of conductive powder and polyimide resin should be more than 80:20 by weight. If the ratio of the conductive powder is less than 80 wt %, conductivity may be severely limited or lacking in dried film.

The organic solvent used in this paste can be any solvent in which the polyimide resin is soluble. Examples of useful solvents include, esters such as ethyl lactate, or butyl lactate, ketones such as cyclohexanone, cycloahiphatic solvent such as γ-butyrolactone, or nitrogen containing solvent such as n-methyl pyrrolidone.

The preparation of the conductive paste based on the organic polyimide of he present invention can be used well-known process, such as roll milling or power mixing.

The invention is illustrated by the following examples which in no way are intended to limit the scope of the invention.

Examples of the organic solvent soluble polyimide resin of the present invention may be obtained from, for example, Maruzen Petrochemical as PI-100 or PI-117.

EXAMPLE 1

20 parts of the organic solvent soluble polyimide resin according to the present invention was provided as PI-117 and supplied by Maruzen Petrochemical was dissolved in 80 parts of butyl lactate, and the polyimide solution was obtained. Then 71 parts of flake type silver powder (averaged particle size: 3 μm) and 29 parts of the above polyimide solution was mixed well by the roll milling process, and the conductive paste having 29 Pa.S viscosity at 25° C. was obtained.

The conductive circuit using this paste was applied on the glass substrate and it was dried for 30 minutes at 100° C., 130° C., and 160° C., respectively. The resistivity of each drying temperature measured was as follows:

| Dry Temperature for 30 min | Resistivity |
| --- | --- |
| 100° C. | $2.0 \times 10^{-5}$ Ω cm |
| 130° C. | $2.1 \times 10^{-5}$ Ω cm |
| 160° C. | $2.1 \times 10^{-5}$ Ω cm |

The resistively of this paste dried at 160° C. for 60 minutes was $2.3 \times 10^{-5}$ Ω cm and the resistively of this paste further heated at 260° C. for 10 minutes was $1.6 \times 10^{-5}$ Ω cm (Δ resistively=70%). The weight loss of the dried paste after/ before 260° C. for 10 minutes heating was 0.65% The cross hatch/tape peel adhesion on the glass substrate of the dried paste after 260° C. for 10 minutes heating was 100/100, and no failure was observed.

COMPARATIVE EXAMPLE 1

15 parts of polymethacrylate resin (as arylic resin #2041 supplied by Elvacite) was dissolved in 85 parts of propyleneglycol methyl ether acetate and the acrylic resin solution was obtained. 57 parts of the flake silver powder used in Example 1 and 43 parts of the acrylic resin solution was well mixed by the roll milling process. The conductive paste having 20 Pa.S viscosity at 25° C. was obtained.

The conductive circuit using this conductive paste on the glass substrate same as Example 1, and it was dried at 160° C. for 60 minutes. The resistively of the dried paste was $1.5 \times 10^{-5}$ Ω cm. The resistively of the dried pasted heated further 260° C. for 10 minutes was $0.8 \times 10^{-5}$ Ω cm (Δ resistively=53%). The weight loss of the dried paste after/before 260° C. for 10 minutes heating was 10%. That suggested almost all resin was removed during the 260° C. heating. As a result, cross hatch/tape peel adhesion of the dried paste after further 260° C. for 10 minutes was 0/100, the dried film was completely broken.

As can be seen from the Example and its Comparative, the conductor composition of the present invention gave the almost same resistively without depending on the drying temperature. After heating at 260° C. the dried paste was not damaged by the heat attack. On the other hand, acrylic resin, a typical "thermoplastic" resin based conductive paste was attacked and damaged by high heating.

What is claimed is:

1. A conductor composition comprising an electrically conductive powder, an organic solvent soluble, polyimide resin and solvent wherein the ratio of conductive powder to organic resin is from 80:20 to 99:1 and wherein polyimide resin comprises chemical units selected from:

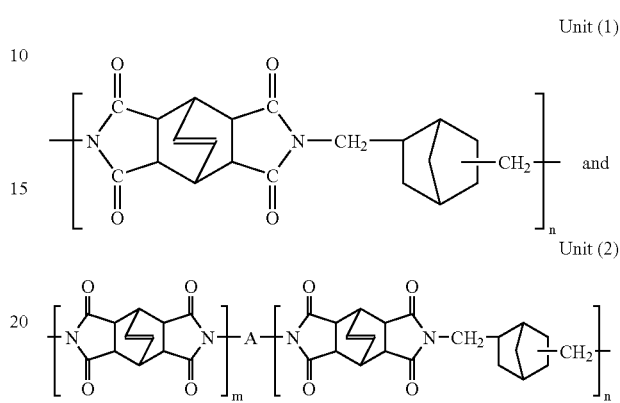

and mixtures of these units and wherein in unit (2) the range of the mole ratio m to n is from 90 to 10 to 10 to 90 and "A" represents a diamine compounds which bond the structures chemically into polyimide units of the resin.

2. The conductor composition of claim 1, wherein "A" is selected from 2,2-bis[4-(amino phenoxy)phenyl]propane, diamino siloxane compounds and mixtures of these.

* * * * *